(12) United States Patent
Hotta et al.

(10) Patent No.: US 9,077,122 B2
(45) Date of Patent: Jul. 7, 2015

(54) STRUCTURE HAVING CIRCUIT BOARDS CONNECTED THEREIN AND METHOD FOR CONNECTING CIRCUIT BOARDS

(71) Applicant: FUJIFILM Corporation, Tokyo (JP)

(72) Inventors: Yoshinori Hotta, Haibara-gun (JP); Yusuke Hatanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 140 days.

(21) Appl. No.: 13/853,819

(22) Filed: Mar. 29, 2013

(65) Prior Publication Data

US 2013/0252443 A1   Sep. 26, 2013

Related U.S. Application Data

(63) Continuation of application No. PCT/JP2011/071835, filed on Sep. 26, 2011.

(30) Foreign Application Priority Data

Oct. 1, 2010  (JP) ................................. 2010-224085

(51) Int. Cl.
  *H01R 12/00*  (2006.01)
  *H01R 12/70*  (2011.01)
  (Continued)

(52) U.S. Cl.
  CPC ....... *H01R 12/7082* (2013.01); *Y10T 29/49126* (2015.01); *G01R 1/0735* (2013.01); *G01R 31/2889* (2013.01); *H01R 12/732* (2013.01); *H01R 13/2407* (2013.01); *H05K 3/361* (2013.01)

(58) Field of Classification Search
  USPC .................. 439/66, 71, 55, 91, 586, 591; 324/754.03, 754.07, 754.11, 755.01, 324/756.03, 756.07, 762.01, 758.01
  See application file for complete search history.

(56) References Cited

U.S. PATENT DOCUMENTS 5,262,226 A * 11/1993 Yoshida ......................... 428/209
5,800,184 A *  9/1998 Lopergolo et al. .............. 439/66
(Continued)

FOREIGN PATENT DOCUMENTS

CN      1409443 A    4/2003
JP     4-177223 A    6/1992
(Continued)

OTHER PUBLICATIONS

International Search Report of PCT/JP2011/071835; dated Nov. 29, 2011.
(Continued)

*Primary Examiner* — Thanh Tam Le
(74) *Attorney, Agent, or Firm* — Sughrue Mion, PLLC

(57) ABSTRACT

An anisotropic conductive member is connected to a rigid circuit board having a first electrode and a flexible circuit board having a second electrode as a land. A plurality of conductive paths penetrate an insulating base material of the anisotropic conductive member. Each conductive path has a first protrusion and a second protrusion on respective first and second surfaces of the insulating base. The height of the second protrusion is equal to or less than double the thickness of the land. The first protrusion contacts a part of the first electrode. The second protrusion contacts part of the land. The base of the anisotropic conductive member is pressed such that the insulating material is not in direct contact with the flexible circuit board. When attaching the boards, a pressure of 300 MPa to 1,000 MPa is applied to the surfaces of the lands to reduce circuit board breakage.

25 Claims, 5 Drawing Sheets

(51) Int. Cl.
*G01R 1/073* (2006.01)
*G01R 31/28* (2006.01)
*H01R 12/73* (2011.01)
*H01R 13/24* (2006.01)
*H05K 3/36* (2006.01)

(56) References Cited

U.S. PATENT DOCUMENTS

| | | | |
|---|---|---|---|
| 6,168,442 B1 * | 1/2001 | Naoi | 439/91 |
| 6,264,476 B1 * | 7/2001 | Li et al. | 439/66 |
| 6,679,713 B2 | 1/2004 | Miura | |
| 7,160,123 B2 * | 1/2007 | Yamada et al. | 439/91 |
| 7,384,279 B2 * | 6/2008 | Igarashi et al. | 439/91 |
| 7,719,296 B2 * | 5/2010 | Amemiya et al. | 324/756.03 |
| 7,878,818 B2 * | 2/2011 | Cheng et al. | 439/66 |
| 7,931,476 B2 * | 4/2011 | Russell | 439/66 |
| 7,980,861 B2 * | 7/2011 | Tamura | 439/66 |
| 8,066,517 B2 * | 11/2011 | Russell | 439/66 |
| 8,123,529 B2 * | 2/2012 | Beaman | 439/66 |
| 2008/0284042 A1 | 11/2008 | Hotta et al. | |
| 2011/0043239 A1 | 2/2011 | Tomita et al. | |

FOREIGN PATENT DOCUMENTS

| | | |
|---|---|---|
| JP | 2001-141747 A | 5/2001 |
| JP | 2008-153120 A | 7/2008 |
| JP | 2008-218185 A | 9/2008 |
| JP | 2008-270158 A | 11/2008 |
| JP | 2009-224146 A | 10/2009 |
| JP | 2010-19672 A | 1/2010 |
| JP | 2010-177171 A | 8/2010 |
| WO | 2009/113486 A1 | 9/2009 |

OTHER PUBLICATIONS

First Office Action, dated Jul. 10, 2014, issued in corresponding CN Application No. 201180047777.8, 18 pages in English and Chinese.
Notification of Reasons for Refusal, dated Jun. 17, 2014, issued in corresponding JP Application No. 2010-224085, 6 pages in English and Japanese.
International Preliminary Report on Patentability and Written Opinion, mailed Apr. 18, 2013, issued in corresponding International Application No. PCT/JP2011/071835, 7 pages in English.
Decision of Refusal, dated Feb. 3, 2015, issued in corresponding JP Application No. 2010-224085, 5 pages in English and Japanese.
The Second Office Action, dated Mar. 9, 2015, issued in corresponding CN Application No. 201180047777.8, 19 pages in English and Chinese.

* cited by examiner

STRUCTURE HAVING CIRCUIT BOARDS CONNECTED THEREIN AND METHOD FOR CONNECTING CIRCUIT BOARDS

CROSS REFERENCES TO RELATED APPLICATIONS

The present application is a continuation application of International Application No. PCT/JP2011/071835 filed on Sep. 26, 2011, and claims priority based on Japanese Patent Application No. 2010-224085 filed on Oct. 1, 2010, the entire content of both of which is incorporated herein by reference.

TECHNICAL FIELD

The present invention relates to a circuit board connecting structure capable of electronically connecting circuit boards detachably for application in probe devices that are used to inspect sheet-shaped products such as liquid crystal panels and integrated circuits.

BACKGROUND OF THE INVENTION

Sheet-shaped objects such as integrated circuits and liquid crystal display panels are generally inspected using a probe device exemplified by a probe card and a probe unit.

JP 2001-141747 A describes a probe device used to conduct an energization test of display circuit boards used in display devices such as liquid crystal display panels.

The probe device 10 described in JP 2001-141747 A connects a plurality of sheets each having a plurality of lines formed by photolithography on one surface of an electrically insulating film 38. The lines extend parallel to each other in forward and backward direction, spaced apart in left and right direction, as illustrated in FIG. 7. A first connection sheet 20 has a plurality of lines 34 and 36 formed by a circuit printing technique on one surface of the electrically insulating film 38 such as one made of polyimide and has a TAB-mounted chip (integrated circuit) 40 electrically connected to the lines 34 and 36 on the one surface. The TAB-mounted chip (integrated circuit) 40 is connected to a probe sheet 18, and the first connection sheet 20 is electrically connected to a second connection sheet 22.

In an energization test (in an inspection process), test signals are supplied to the TAB-mounted chip (integrated circuit) 40 via a wiring member 46, the second connection sheet 22, and the first connection sheet 20, with projecting electrodes 30 provided at the foremost end portions of the lines on the probe sheet 18 pressed against respective electrodes 44 of the display circuit boards of a liquid crystal panel 42 as illustrated in FIG. 6.

The probe sheet 18, attached to the underside of a probe holder 24, constitutes a probe block. The probe holder 24 can be attached to or detached from the underside of the forward end portion of a probe base 48 by moving the probe holder 24 forward and backward relative to the probe base 48 and is removably secured to the probe base 48 by means of a screw member 49.

As illustrated in FIG. 6, the lines on the probe sheet 18 are electrically connected to the lines on the wiring member 46 provided on the underside of the probe base 48 via the lines on the first connection sheet 20 and the lines on the second connection sheet 22 provided on the underside of the probe holder 24.

Thus, in the display circuit boards of the liquid crystal panel 42, drive signals are supplied via the TAB-mounted chip (integrated circuit) 40, the first connection sheet 20, and the probe sheet 18 to the electrodes 44 determined by an input signal.

However, the TAB-mounted chip (integrated circuit) 40 is used as the first connection sheet 20 and, in addition, the foremost end portion of the TAB-mounted chip is bonded to the probe sheet 18 although the probe, in particular the probe sheet 18, of the above conventional device needs to be replaced occasionally because of worn or broken projecting electrodes 30.

Therefore, to replace the probe sheet 18, the probe sheet 18 needed to be peeled off from the first connection sheet 20, and in the process, lines on the first connection sheet 20 were often broken, necessitating replacement of also the first connection sheet 20.

Therefore, a study is being made of a possibility of using, in place of the TAB-mounted chip, an anisotropic conductive film (of conductive particles-containing resin type) 54 wherein, as illustrated in FIG. 4, the respective electrodes of a circuit board 58, corresponding to the first connection sheet, and a circuit board 70, corresponding to the probe sheet, are electrically connected by dispersing fine conductive particles 52 in a resin 50, and wherein the circuit boards 58 and 70 are bonded to each other under pressure to establish electrical connection. However, because the electrical connection through the anisotropic conductive film 54 is achieved by using the property thereof, i.e., by allowing the thermoplastic resin 50 to penetrate the non-electrode portion, the anisotropic conductive film 54 was often broken when the resin 50 and the circuit board 70, serving as the probe sheet, bonded to each other at a portion 56 where the resin and the circuit board are in contact, are detached from each other for replacement. An attempt to solve the above problem by not bonding the probe sheet and the resin of the anisotropic conductive film results in, for example, electrical disconnection between the lines on the probe sheet 18 and the lines on the first connection sheet 20 illustrated in FIG. 7 in the mounting process.

JP 2008-270158 A proposes an anisotropic conductive material wherein conductive members penetrate a film made of an insulating material.

JP 2009-224146 A describes studying a possibility of a technique of connecting a circuit board 58 and an electronic component 68 using an anisotropic conductive film 60 having transmembrane electrodes in an inorganic insulating film as illustrated in FIG. 5.

However, the inventors of the present invention found the following problems in using an anisotropic conductive film that employs an inorganic film.

There is practically a variation 62 in height among the electrodes within a circuit board. For the inorganic film alone to compensate for the height variation, the film, a hard, inorganic film, needs to warp. The warping causes a distortion 66 in the anisotropic conductive film 60, which may cause the film to break. In addition, ever smaller pitches are reducing the distance between electrodes, so that there is a limit to the extent to which the warping of the anisotropic conductive film can compensate for the distortion 66 caused in the anisotropic conductive film.

The present inventors made an in-depth study on resin-made anisotropic conductive films and inorganic anisotropic conductive films to solve the above problems.

The contact of the circuit board 70 and the anisotropic conductive film 54 is mostly making detachment of the circuit board 70 from the anisotropic conductive film 54 shown in FIG. 4 difficult. When, in particular, use is made of a resin-made anisotropic conductive film, the affinity with the resin layer forming the surface of the circuit board is so great as to result in bonding when the close contact is allowed to last for a long time. To avoid this, the thickness of the anisotropic conductive film needs to be smaller than that of the electrodes so that the anisotropic conductive film resin does not invade the non-electrode portion. In order to reduce the thickness of the anisotropic conductive film and still secure connection reliability, increasing the density of the conductive particles is essential, but further increasing the present density is difficult.

Hardening the resin may be one of the means but would reduce the probability of connection achieved by the conductive particles and reduce the connection reliability.

On the other hand, an anisotropic conductive material using an inorganic anisotropic conductive film, whose matrix is composed of a hard film, only contacts metallic electrodes because of its properties, and contact with a circuit board is avoided, which makes an anisotropic conductive material effective in avoiding the above problems. However, such anisotropic conductive material still cannot address the problem of the electrode height variation. Addressing the electrode height variation requires the use of a component capable of plastic deformation. There are two kinds of height variation: one occurring within one electrode surface, i.e., one caused by a surface roughness of the plated surface; the other attributable to a variation in plating among electrodes. The variation of the former kind is about 1 µm; the variation of the latter kind is about 2 µm to 5 µm. It is possible that the variation of the former kind is related to the elasticity of the film with respect to the electrode dimensions; the variation of the latter kind is related to the elasticity of the film with respect to the distance between the electrodes.

In the case of the variation of the latter kind, specifically a small inter-electrode distance resulting from ever decreasing inter-electrode pitches in the industry increases the ratio (R/L) of plating-caused variation length (R) to the inter-electrode distance (L), making it difficult to address the problem with an inorganic film.

SUMMARY OF THE INVENTION

An object of the present invention is to provide a connection method of connecting a flexible circuit board and a rigid circuit board, the method permitting ready detachment of a circuit board for replacement when necessary without an anisotropic conductive film being broken and enabling repeated use, the method being capable of absorbing an electrode height variation when the circuit boards are in connection, thus providing a high connection reliability and making the method applicable to an electrode structure having a small inter-electrode distance. It was found through an intensive study that the problem of electrode height variation can be addressed by allowing a metal such as copper or nickel, used in the anisotropic conductive member as a conductor, to project by a great projection amount and using the plastic deformation region of the projecting metal.

It was also found that the connection can be assured and connection reliability can be further secured by controlling the pressurizing force when the circuit boards are in connection.

Unless a certain pressurizing force is reached, the projecting metal and the metal electrodes (lands) are only in contact, resulting in a high resistance. Where, on the other hand, the pressurizing force is too high, the inorganic film itself is broken, making repeated use impossible.

As specific means, contact with the circuit board portion other than the electrodes is inhibited to facilitate detachment when detachment is to be made, and the conductor projecting portions serving as a plastic deformation layer for absorbing the electrode height variation is 5 µm or more. It was further found that, controlling the pressurizing force (pressing force) so as to place the projecting portions into full, close contact with the electrodes of a circuit board is important to secure an electrical connection reliability.

Thus, the present invention provides the following.

A circuit board connecting structure 100 comprising: a rigid circuit board 101 having a first electrode 121,
an anisotropic conductive member 120, and
a flexible circuit board 102 having a second electrode as a land 122 formed on the circuit board, with a support plate 114 provided in direct contact with at least part of a flat surface of the flexible circuit board opposite from the rigid circuit board,
the anisotropic conductive member 120 being connected to the rigid circuit board and the flexible circuit board through the support plate 114 using a pressure member 110,
wherein the anisotropic conductive member 120 includes conductive passages 111 penetrating an insulating matrix 109 in a thickness direction of the insulating matrix, the conductive passages 111 being made of a conductive material and isolated from each other, one end of each of the conductive passages having a first projecting portion 113 projecting from one surface of the insulating matrix 109 and another end of each of the conductive passages having a second projecting portion 115 projecting from another surface of the insulating matrix, a height $H_{2a}$ of the second projecting portion 115 out of contact being 5 µm or more and not greater than twice a thickness of the land 122 as measured from a surface of the flexible circuit board 102,
wherein a pressure is applied such that electrical connection between the rigid circuit board 101 and the flexible circuit board 102 is achieved as the first projecting portions 113 of the conductive passages 111 contact at least part of the first electrode 121 of the rigid circuit board 101 and the second projecting portions 115 communicating with the first projecting portions through the conductive passages contact at least part of the surface of the land 122 formed on the flexible circuit board while the insulating matrix 109 of the anisotropic conductive member 120 does not directly contact the flexible circuit board 102, and
wherein the pressure applied to the surface of the land 122 is 300 MPa inclusive to 1000 MPa inclusive.

The numerals used above do not limit the invention and are used to refer to examples only to aid in understanding the invention.

When the circuit board connecting structure of the invention is used to electrically connect a rigid circuit board and a flexible circuit board, circuit boards each having a miniaturized wiring structure can be electrically connected in a stable manner and with a low resistance without allowing, for example, unnecessary bonding to the non-electrode members to occur when connection is made, reducing the possibility of the circuit boards being broken by an unnecessary load applied thereto in detachment. The anisotropic conductive member can be repeatedly used, therefore reduce costs, and can be applied for a connection of circuit boards carrying electrodes spaced at a small pitch.

BRIEF DESCRIPTION OF DRAWINGS

FIG. 2 is a schematic diagram illustrating an example of preferred embodiment of the anisotropic conductive member.

DESCRIPTION OF EMBODIMENTS

A circuit board connecting structure 100 of the invention is described below with reference to FIGS. 1 to 3.

Figure 1A:
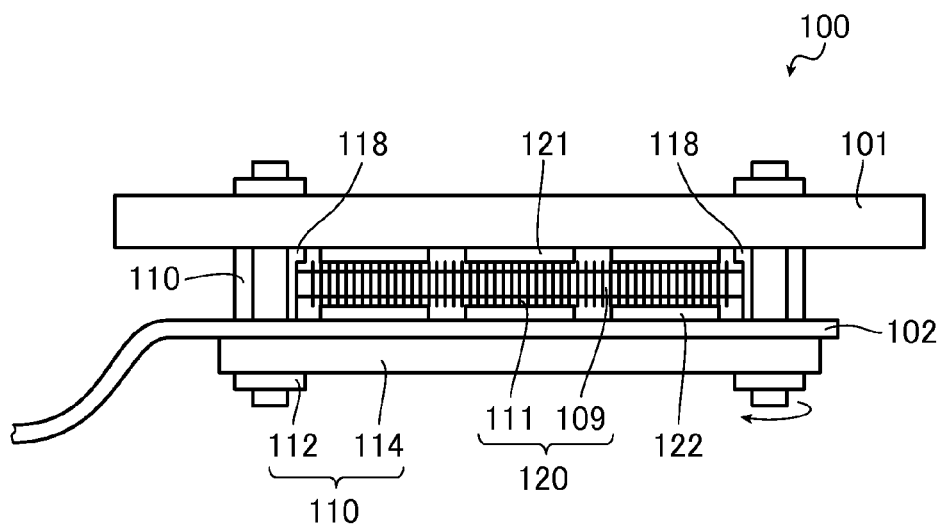
FIG. 1A is a cross section of a circuit board connecting structure of the invention.
Figure 1B:
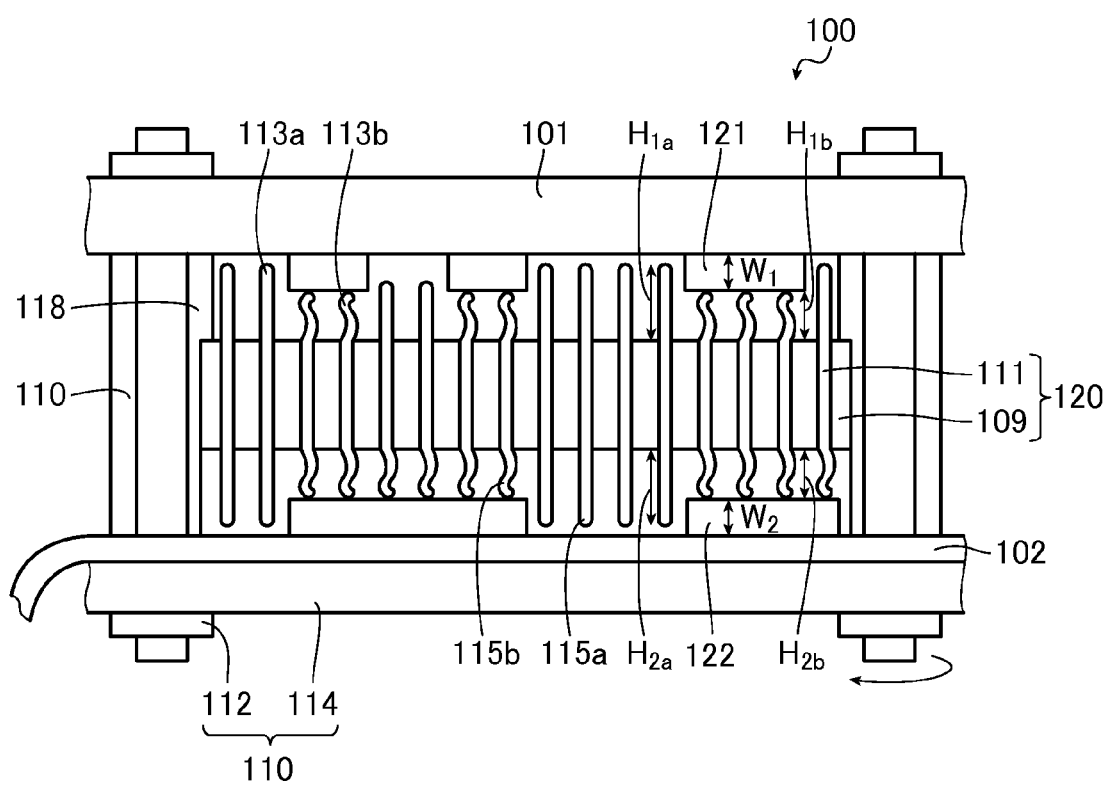
FIG. 1B is an enlarged schematic diagram for explaining a relationship between an anisotropic conductive member and electrodes shown in FIG. 1A.

FIGS. 1A and 1B are cross sections illustrating a schematic configuration of a preferred embodiment of the circuit board connecting structure of the invention. FIG. 1B shows conductive passages of FIG. 1A on an enlarged scale to explain a connection achieved by the conductive passages.

As illustrated in FIGS. 1A and 1B, the circuit board connecting structure 100 of the invention can electrically connect and disconnect the following components:

a rigid circuit board 101 having first electrodes 121, an anisotropic conductive member 120, and a flexible circuit board 102 having second electrodes as lands 122 formed on the circuit board.

In electrical connection, a support plate 114 is provided so as to be in direct contact with at least part of a flat surface of the flexible circuit board that is on the side opposite from the rigid circuit board; connection is achieved using a pressure member 110 adapted to urge the anisotropic conductive member 120 onto the rigid circuit board and the flexible circuit board through the support plate 114.

In electrical connection, the circuit board connecting structure 100 of the invention is pressurized, so that the height of projecting portions in electrical connection differs from that in electrical disconnection, which is a characteristic of the structure 100.

In the description to follow, micrometer is the unit of length used to represent, for example, distance, height, and thickness unless stated otherwise.

$H_{1a}$ is a height of first projecting portions 113 in disconnection; $H_{1b}$ is a height of the first projecting portions 113 in connection. Disconnection herein denotes electrical disconnection; connection denotes electrical connection.

$H_{2a}$ is a height of second projecting portions 115 in disconnection; $H_{2b}$ is a height of the second projecting portions 115 in connection.

As illustrated in FIG. 1B, the anisotropic conductive member 120 has conductive passages 111 made of a conductive material insulated from each other and piercing the insulating matrix 109 in the thickness direction thereof and comprises the first projecting portions 113 of the conductive passages 111 projecting from one of the surfaces of the insulating matrix and the second projecting portions 115 of the conductive passages 111 projecting from the other surface of the insulating matrix.

The height $H_{2a}$ of the second projecting portions 115 in disconnection is 5 μm or more and not greater than twice a thickness $W_2$ of the lands 122 as measured from the surface of the flexible circuit board 102.

$$5\ \mu m \leq H_{2a}(\mu m) \leq 2 \times W_2(\mu m) \quad \text{Inequality (1)}$$

When the height $H_{2a}$ of the projecting portions 115 in disconnection is in the above range, the electrode height and the height of the projecting portions of the conductive passages are in a desirable relationship such that the electrodes and the projecting portions of the conductive passages can be connected in a stable manner.

Preferably, the height $H_{1a}$ of the first projecting portions 113 in disconnection is 5 μm or more and not greater than twice a thickness $W_1$ of the electrodes 121 as measured from the surface of the rigid circuit board 101.

$$5\ \mu m \leq H_{1a}(\mu m) \leq 2 \times W_1(\mu m) \quad \text{Inequality (2)}$$

Generally, the upper limit of the height $W_1$ on the rigid circuit board is about 30 μm; the upper limit of the height $W_2$ of the electrode bumps formed on the flexible circuit board is about 100 μm.

The first projecting portions 113 are the projecting portions on the side on which the anisotropic conductive member connects with the rigid circuit board; the second projecting portions 115 are the projecting portions on the side on which the anisotropic conductive member connects with the flexible circuit board. The height of the first projecting portions 113 and the height of the second projecting portions 115 may be equal or different.

Preferably, the following relationships hold.

$$H_{1a} - H_{1b} \leq W_1 \quad \text{Inequality (3)}$$

$$H_{2a} - H_{2b} \leq W_2 \quad \text{Inequality (4)}$$

where $W_1$ is the projection height of the electrodes 121 measured from the surface of the rigid circuit board; $W_2$ is the projection height of the lands 122 measured from the surface of the flexible circuit board.

Preferably, the following relationships hold.

$$H_{1a} - H_{1b} < W_1 \quad \text{Inequality (5)}$$

$$H_{2a} - H_{2b} < W_2 \quad \text{Inequality (6)}$$

Pressure is applied such that electrical connection between the rigid circuit board 101 and the flexible circuit board 102 is achieved as the first projecting portions 113 of the conductive passages 111 contact at least part of the first electrodes 121 of the rigid circuit board 101 and the second projecting portions 115 communicating with the first projecting portions through the conductive passages contact at least part of the surfaces of the lands 122 formed on the flexible circuit board 122 while the insulating matrix 109 of the anisotropic conductive member 120 does not directly contact the flexible circuit board 102. In this state, the pressure applied to the surfaces of the lands 122 is 300 MPa inclusive to 1000 MPa inclusive.

Preferably, the distance $L_{101}$-$L_{102}$ between the plane formed by the surface of the rigid circuit board 101 carrying the electrodes 121 and the plane formed by the surface of the flexible circuit board 102 carrying the lands 122 in electrical connection when the pressure applied to the surfaces of the lands 122 is 300 MPa inclusive to 1000 MPa inclusive is:

$$L_{101} - L_{102} \leq L_{109} + W_1 + W_2 + H_{1a} + H_{2a} \quad \text{Inequality (7)}$$

where $L_{109}$ is the thickness of the insulating matrix.

The relationship defined by the inequality (7) represents the heights of the first projecting portions and the second projecting portions in connection that are smaller than in disconnection as illustrated in FIG. 1B. Thus, the first and the second projecting portions of the conductive passages of the anisotropic conductive member 120 are in a compressed state while in electrical connection.

A reduction Δ resulting from the compression is expressed as:

$$\Delta = (L_{109} + W_1 + W_2 + H_{1a} + H_{2a}) - (L_{101} - L_{102}) \qquad \text{Equality (8)}$$

where Δ is preferably 0 μm to 10 μm, more preferably, 1 μm to 6 μm.

[Pressure]

The pressure (Pa) herein is a force (N) per unit area (m²) applied to the surfaces of the electrodes to urge the anisotropic conductive member 120 onto the rigid circuit board and the flexible circuit board through the support plate 114 such that the insulating matrix 109 of the anisotropic conductive member 120 is kept out of direct contact with the flexible circuit board 102.

The pressure applied to the surfaces of the lands 122, the second electrodes, is theoretically equal to the pressure applied to the surfaces of the first electrodes. When the pressure is in the above range, stable electrical connection is achieved with a small resistance, and unnecessary bonding to the non-electrode members does not occur in electrical connection, reducing the possibility of circuit boards being broken by unnecessary force applied in detachment.

The circuit board connecting structure of the present invention is described in detail below.

1. [Rigid Circuit Board]

The rigid circuit board, preferably a rigid printed circuit board, is held as a flat sheet in use in the circuit board connecting structure of the invention. The rigid board herein denotes a board made of a material or made into a thickness having or providing a rigidity whereby the pressure can be evenly applied thereto without the need to specifically use a support plate or a holder plate. The rigid circuit board is normally held in a horizontal or vertical position but may be held in a diagonal position. The thickness of the board is preferably 0.3 mm to 1.6 mm. There have been developed and placed on the market a variety of boards that may be used as the rigid circuit board herein, including paper phenolic boards, paper epoxy boards, glass composite boards, glass epoxy boards, Teflon (registered trademark) boards, alumina (ceramic) boards, low-temperature co-fired ceramic (LTCC) boards, and composite boards. While any of such boards may be used in the present invention, use is preferably made of a glass epoxy board, a ceramic board, or an LTCC board, which exhibits a relatively small warp, where it is assumed that electrical connection is to be achieved by application of pressure via the anisotropic conductive member without using a special holder plate.

Where, in particular, the circuit board connecting structure of the invention is used as a probe card connecting structure, and when an integrated device is inspected, a high frequency characteristic is required. For such application, a ceramic board or an LTCC board is preferably used.

A glass epoxy board, obtained by impregnating a laminate of glass fiber cloths with an epoxy resin, excels in both electric characteristics and mechanical properties and hence used most widely to manufacture a rigid printed circuit board of surface mount type.

An alumina (ceramic) board is manufactured by applying and laminating patterns of, for example, tungsten onto an alumina (aluminum oxide) base called green sheet and baking the laminate. An alumina board excels in high frequency characteristic and thermal conductivity. However, the manufacturing method (high temperature baking) makes wiring formation difficult. As a solution, the low-temperature co-fired ceramic (LTCC) board was developed. Because ceramic is mixed with glass, and the mixture is baked at a low temperature, 800° C., use of copper in wiring has been made possible. An LTCC board characteristically has a small thermal expansion coefficient and an excellent insulation characteristic.

2. [Flexible Circuit Board]

The flexible circuit board, preferably a flexible printed circuit board, is flexible and permits significant deformation. It is also called FPC (flexible printed circuits) for short.

A typical flexible circuit board has a structure having an adhesion layer formed on a 12 μm to 50 μm thick insulating material in the form of a film (base film), on which a conductive foil having a thickness of about 12 μm to 50 μm is further formed. A flexible circuit board is thus relatively thin as compared with a typical rigid circuit board, which has a total thickness of 0.3 mm to 1.6 mm. In the circuit board connecting structure of the present invention, the flexible circuit board is used together with an auxiliary tool such as a support plate (holder plate) for holding the flexible circuit board in a flat position. When the flexible circuit board is electrically or mechanically connected to another member than the connecting structure of the invention, the flexible circuit board can be, where necessary, bent into a desired shape, wound, or formed into an S-shaped or L-shaped position using its flexibility. A polyimide material developed by du Pont is most suitable as the base film. The other portions than the terminal portions and soldered portions are protected by being covered by an insulating material composed of a polyimide film or a photo-solder-resist film called a cover lay.

A conductive material generally used to form the wiring on the flexible printed circuit board is copper. A flexible circuit board can be repeatedly deformed with a small force and is widely used as probe sheet employed in probe cards for its characteristic of maintaining its electrical properties also when deformed. The flexible printed circuit board used in the present invention is not specifically limited and may be a known or a commercially available flexible circuit board.

The flexible printed circuit board has on the connecting portions thereof "lands," which are connection electrodes each having a given area. The lands are each made of a 10-μm to 50-μm thick conductive foil provided on the flexible board; Cu or Au may be deposited in thickness of 1 μm to 20 μm on such land pattern formed of conductive foils considering the thickness of the insulating coating layer called a cover lay using a plating method in order to secure the connection reliability. The plated land surface, having small asperities, may be made flat or dimpleless using a special machining device exemplified by a surface planer (manufactured by Disco Corporation) to enhance connection reliability. Planarizing is effective to make the heights of the electrodes (heights of the lands) equal, which makes it easier to secure an effective contact area with the anisotropic conductive member of the invention. On the other hand, planarizing requires a long time and is significantly expensive, making it difficult to use the process in mass production.

3. [Pressure Member]

The pressure member 110 comprises the support plate 114 and a pressurizing mechanism 112.

The pressurizing mechanism may be a known pressurizing mechanism and is not specifically limited. The examples thereof include screws and nuts; a mechanism including screws, nuts, and springs; a clamp; a plunger (elastic holder, ball and spring); and an engaging structure.

The support plate 114, also called a holder plate (a transparent plate made of, for example, glass; flat plate used in a probe device) is preferably a sheet-shaped material that is insulating, has a high rigidity, and has a highly smooth surface. Materials preferred include glass plates and ceramic plates. Use may also be made of a glass epoxy resin plate. Use may also be made of a stainless substrate coated with a resin so as to be provided with insulation. The support plate need not be a plate specifically provided for the purpose but may be a part of a device, such as a wall surface or a bottom surface of a probe device, to which can be installed the circuit board connecting structure of the invention.

The pressurizing mechanism preferably permits pressure adjustment. Where the pressure is known because the circuit board connecting structure has already been designed, the pressurizing mechanism need not be pressure-adjustable and need only have a structure capable of applying a required pressure.

4. [Anisotropic Conductive Member]

Figure 2A:
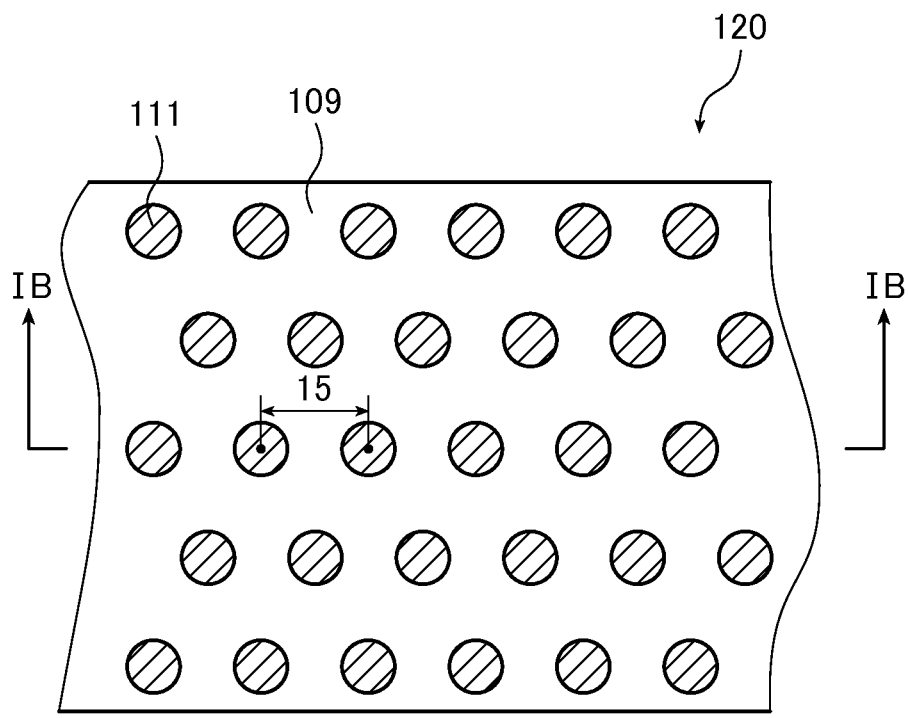
FIG. 2A is a front view (plan view)
Figure 2B:
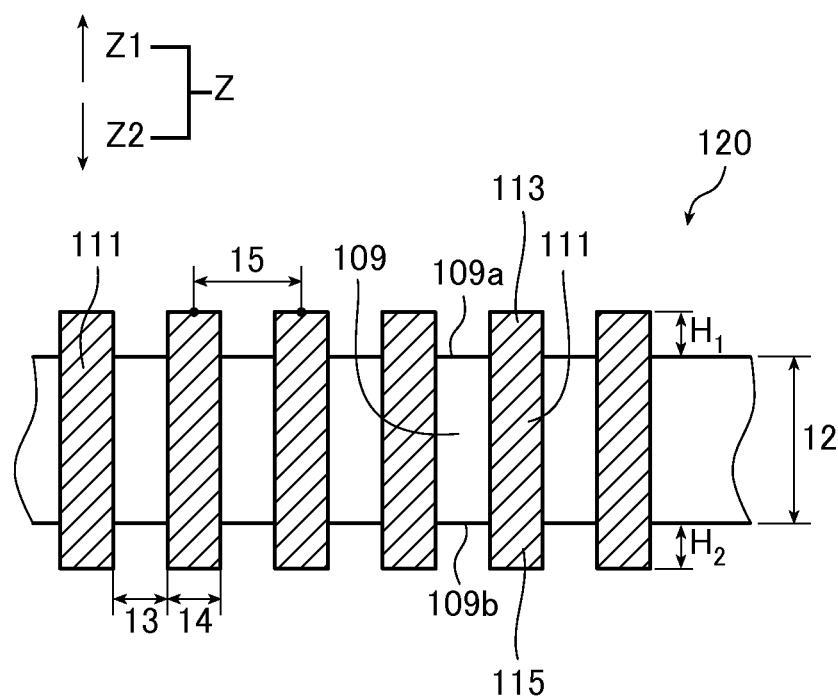
FIG. 2B is a cross section taken along line IB-IB of FIG. 2A.

FIG. 2 is a schematic diagram illustrating an example of a preferred embodiment of the anisotropic conductive member: FIG. 2A is a plan view; FIG. 2B is a cross section taken along line IB-IB of FIG. 2A.

The anisotropic conductive member 120 comprises the insulating matrix 109 and the conductive passages 111 formed of the conductive members.

The conductive passages 111 have an axial length that is longer than the length (thickness) of the insulating matrix 109 in the thickness-wise direction Z (Z1, Z2). The conductive passages 111, insulated from each other, penetrate the insulating matrix 109.

One end of each of the conductive passages 111 projects from one side of the insulating matrix 109; the other end of each of the conductive passages 111 projects from the other side of the insulating matrix 109. Thus, each of the conductive passages 111 has the first projecting portion 113 and the second projecting portion 115 at the respective ends thereof projecting from a major surface 109a and another major surface 109b, respectively.

Preferably, at least the sections of the conductive passages 111 inside the insulating matrix 109 (hereinafter also referred to as "intra-matrix sections of the conductive passages ill") are substantially parallel (parallel in FIG. 2) to the thickness-wise direction Z (Z1, Z2) of the insulating matrix 109. Specifically, the relative length of the center line of the intra-matrix sections of the conductive passages with respect to the thickness of the insulating matrix (length/thickness) is preferably 1.0 to 1.2, more preferably 1.0 to 1.05.

Next, the materials, dimensions, and the method of forming the insulating matrix and the conductive passages are described below.

<Insulating Matrix>

The insulating matrix constituting part of the anisotropic conductive member is a structure consisting of an anodic oxide film having micropores obtained by anodizing an aluminum substrate.

Using such structure, a good connection stability is maintained even after exposure to a high temperature, and displacements in connections and contacts between components of the circuit board connecting structure of the invention do not readily occur even through repeated use.

This is considered to be due to the fact that the insulating matrix, containing alumina, an inorganic material, having a thermal expansion coefficient of $4.5 \times 10^{-6}$ K$^{-1}$ as a major component, excels in heat resistance and has a thermal expansion coefficient that is close to that of materials (e.g. ceramic) of inspection circuit boards in general.

For the purpose of the invention, the degree of ordering of micropores as defined by formula (i) is preferably at least 50%, more preferably at least 70%, and most preferably at least 80%.

When the degree of ordering is in the above range, the insulation in the plane direction of the anisotropic conductive member 120, particularly with a high frequency signal of 100 kHz or more, can be assured with an increased reliability.

$$\text{Degree of ordering}(\%) = B/A \times 100 \quad \text{(i)}$$

In formula (i), A represents the total number of micropores in a measurement region. B represents the number of such micropores in the measurement region that, when a circle having its center at the center of gravity of a given one of such micropores is drawn so as to have a smallest possible radius and have another micropore inscribed therein, the circle contains the centers of gravity in cross section of six micropores in addition to the given micropore.

FIG. 3 illustrates a method of computing the degree of ordering of micropores. Above formula (i) is explained more specifically below with reference to FIG. 3.

Figure 3A:
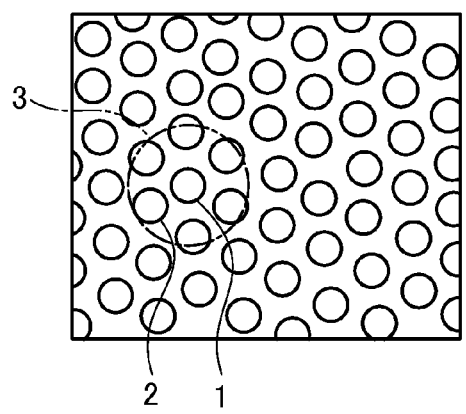
FIGS. 3A and 3B illustrate a method of computing the degree of ordering of micropores.

With reference to FIG. 3A, when a circle 3 having its center at the center of gravity of a micropore 1 is drawn so as to have a smallest possible radius and have another micropore (micropore 2) inscribed therein, the circle 3 contains the centers of gravity of six micropores in addition to the micropore 1. Therefore, the micropore 1 is included in B.

Figure 3B:
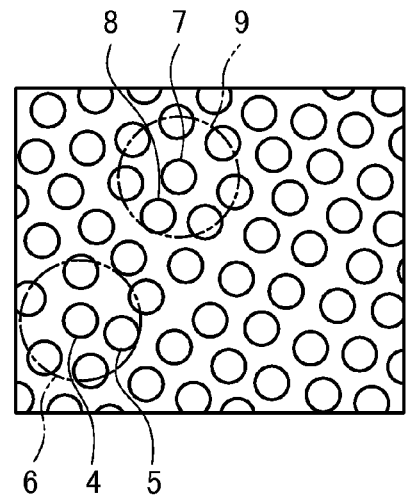
Figure 4:
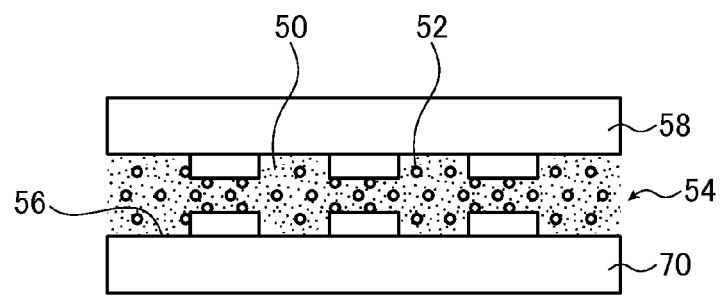
FIG. 4 is a schematic cross section for explaining a connection of circuit boards through an anisotropic conductive film made of a resin containing conductive particles known in the art.
Figure 5:
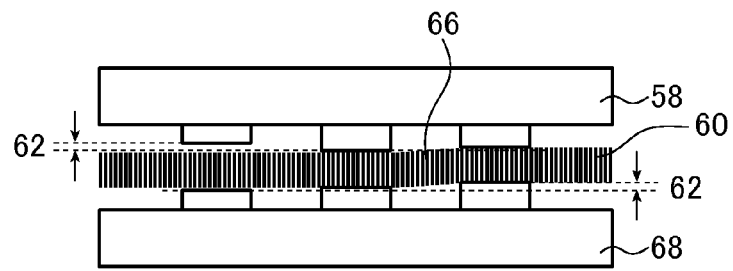
FIG. 5 is a schematic cross section for explaining a connection of a circuit board and an electronic component using an anisotropic conductive film having transmembrane electrodes in an inorganic insulating film as known in the art.
Figure 6:
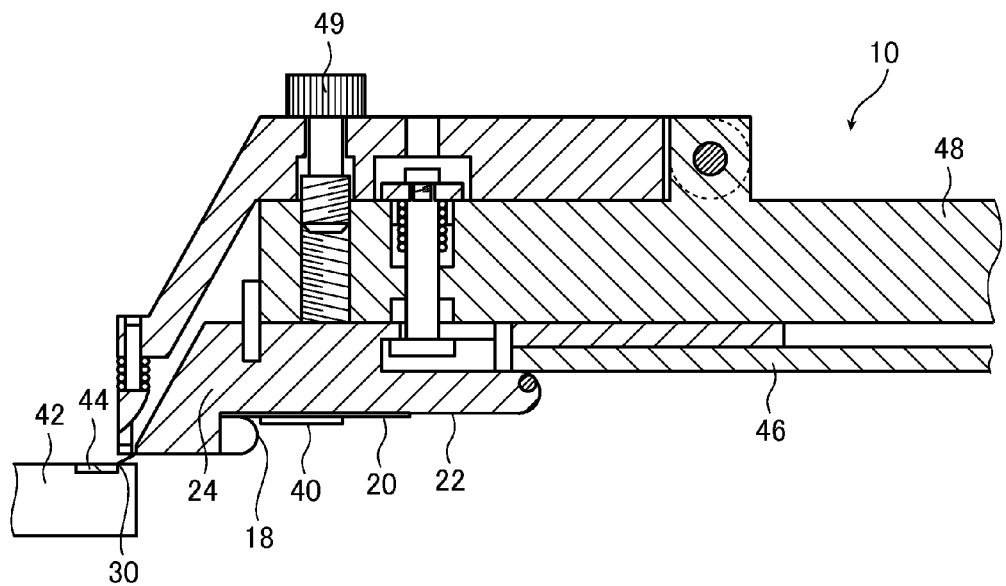
FIG. 6 is a cross section for explaining a probe device known in the art.
Figure 7:
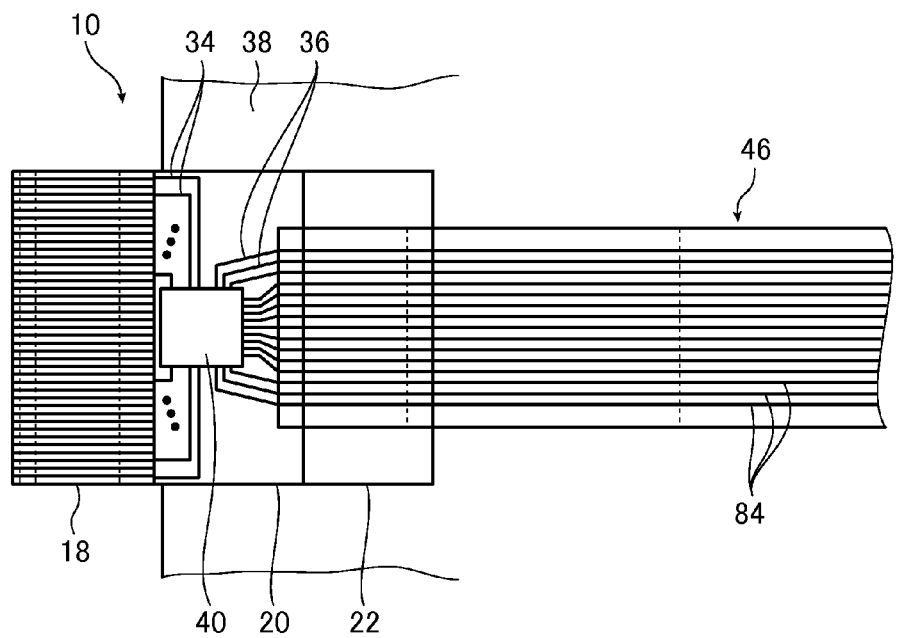
FIG. 7 is a diagram for explaining a probe device known in the art.

With reference to FIG. 3B, when a circle 6 having its center at the center of gravity of a micropore 4 is drawn so as to have a smallest possible radius and have another micropore (micropore 5) inscribed therein, the circle 6 contains the centers of gravity of five micropores in addition to the micropore 4. Therefore, the micropore 4 is not included in B.

Also with reference to FIG. 3B, when a circle 9 having its center at the center of gravity of a micropore 7 is drawn so as to have a smallest possible radius and have another micropore (micropore 8) inscribed therein, the circle 9 contains the centers of gravity of seven micropores in addition to the micropore 7. Therefore, the micropore 7 is not included in B.

Considering the straight configuration of the conductive passages described later, it is preferable that the micropores do not have a bifurcate configuration. That is, the ratio of a number X of micropores in unit area of one surface of the anodic oxide film to a number Y of micropores in unit area of the other surface, X/Y, is preferably 0.9 to 1.10, more preferably 0.95 to 1.05, and most preferably 0.98 to 1.02.

Alumina, a material for an anodized aluminum film, has an electric resistivity of about $10^{14}$ Ω·cm, the same as that of insulating matrices constituting, for example, known anisotropic conductive films (e.g., thermoplastic elastomers).

For the purpose of the invention, the insulating matrix preferably has a thickness (indicated by a numeral 12 in FIG. 2B) of 1 μm to 1000 μm, more preferably 5 μm to 500 μm, and most preferably 10 μm to 300 μm. When the thickness of the insulating matrix is in the above range, the insulating matrix is easy to use.

For the purpose of the invention, the spacing interval (indicated by a numeral 13 in FIG. 2B) between the conductive passages in the insulating matrix is preferably 10 nm or more and more preferably 20 nm to 200 nm. The spacing interval between the conductive passages in the insulating matrix in the above range allows the insulating matrix to fully function as insulating wall.

For the purpose of the invention, the center-to-center spacing interval (indicated by a numeral 15 in FIG. 2B and also called "pitch" below) between adjacent conductive passages of the insulating matrix is preferably 20 nm to 500 nm, more preferably 40 nm to 200 nm, and more preferably 50 nm to 140 nm. When the pitch is in the above range, a good relationship between conductive passage diameter and inter-conductive passage distance (insulating wall thickness) is easy to obtain and provides a good connection reliability.

According to the invention, the insulating matrix may be produced by, for example, anodizing an aluminum substrate and allowing the micropores, resulting from the anodization, to penetrate the matrix.

The anodization and penetration processes are explained as the method of producing the anisotropic conductive member is described later.

<Conductive Passages>

The conductive passages constituting part of the anisotropic conductive member are made of a conductive material.

The conductive material is not specifically limited, provided that its electric resistivity is $10^3$ Ω·cm or less, preferable examples thereof including gold (Au), silver (Ag), copper (Cu), aluminum (Al), magnesium (Mg), nickel (Ni), tungsten (W), cobalt (Co), rhodium (Rh), tin oxides, indium-doped tin oxides (ITO), and alloys containing any of these metals as major component.

Considering the electric conductivity, the conductive material is preferably made of one kind of metal selected from the group consisting of copper, nickel, and gold or an alloy containing any of these metals as major component.

The conductive passages of the anisotropic conductive member in the circuit board connecting structure of the invention, having projecting portions adapted to perform a specific function, are preferably made of a material in which the conductive metal itself has a high rigidity, and Ni in particular is preferable.

Considering the costs, use of gold to form only the surface of the projecting portions of the conductive passages projecting from the insulating matrix or only the portions of the circuit board that come into contact with the electrodes is also preferable.

For the purpose of the invention, the conductive passages have a columnar shape, the diameter thereof (the portion indicated by a numeral 14 in FIG. 2B) being preferably 1 μm or less, more preferably 5 nm to 500 nm, still more preferably 20 nm to 400 nm, yet still more preferably 40 nm to 200 nm, and most preferably 50 nm to 100 nm. The diameter of the conductive passages in the above range enables sufficient response to be obtained when an electric signal is applied and therefore enhances the reliability of a semiconductor package using the circuit board connecting structure of the invention.

As described above, the relative length of the center line of the conductive passages (only the intra-matrix section, i.e., the section inside the insulating matrix, of each of the conductive passages; the same applies to the description in this paragraph) with respect to the thickness of the insulating matrix (length/thickness) is preferably 1.0 to 1.2, more preferably 1.0 to 1.05. When the ratio of the center line length of the conductive passages to the thickness of the insulating matrix is in the above range, the conductive passages may be considered to have a straight configuration, and when an electric signal is applied, a one-to-one response can be obtained infallibly, so that the reliability of a device using the circuit board connecting structure of the invention can be enhanced.

For the purpose of the invention, when both ends of the conductive passages project from the respective sides of the insulating matrix, the heights of the projecting portions (indicated by numerals 113 and 115 in FIG. 2B); also referred to as "projecting portions" below) are preferably at least 5 μm and more preferably 8 μm to 15 μm when in electrical disconnection. The heights of the projecting portions in the above range enhance the connectivity with the electrodes of the circuit board.

The projecting portions may have a shape that is not specifically limited and include hemisphere, cone, pyramid, cylinder, and prism.

For the purpose of the invention, the conductive passages are insulated from each other by the insulating matrix and have a density of preferably 2 million/mm$^2$ or more, more preferably 50 million/mm$^2$ or more, and most preferably 100 million/mm$^2$ or more. The density of the conductive passages in the above range enables a one-to-one response to be infallibly obtained when an electric signal is applied and further enhances the reliability of a device using the circuit board connecting structure of the invention.

According to the invention, the conductive passages can be produced by, for example, filling micropores penetrating the insulating matrix with a metal, a conductive material.

The process of filling a metal is explained as the method of producing the anisotropic conductive member is described later.

The anisotropic conductive member comprising such an insulating matrix and conductive passages preferably has such configuration, as described above, that the insulating matrix has a thickness of 1 μm to 1000 μm, and the conductive passages have a diameter of 5 nm to 500 nm, to maintain a high insulation and enable electrical continuity to be verified with a high density.

[Method of Producing Anisotropic Conductive Member]

The method of producing the anisotropic conductive member is described below.

According to the invention, the anisotropic conductive member comprising such an insulating matrix and conductive passages can be manufactured by, for example, a production method described in [0040] of JP 2008-270158 A, which comprises at least, an anodization step of anodizing an aluminum substrate, a penetration step, following the anodization step, of causing the micropores resulting from the anodization to penetrate the anodized aluminum substrate and thereby obtaining the insulating matrix, and, following the penetration step, a metal filling step of filling the inside of the penetrating pores in the obtained insulating matrix with a metal, a conductive material, to obtain the anisotropic conductive film; and a method comprising, following the metal filling step, a projecting portion forming step of causing the end portions of each of the formed conductive passages to project from the respective surfaces of the insulating matrix and thereby obtaining the anisotropic conductive member.

According to the invention, the aluminum substrate used in the method of producing the anisotropic conductive film and the processes of treatment applied to the aluminum substrate as substantially described in [0041] to [0141] of JP 2008-270158 A may be used in the present invention.

The aluminum plate used in the invention is not specifically limited but preferably has an aluminum purity of at least 99.5% by weight, more preferably at least 99.9% by weight, and still more preferably at least 99.99% by weight. When the aluminum purity is in the above range, the orderliness of the array of micropores is sufficient.

While the anodization in the method of producing the anisotropic conductive member may be implemented using a known method, it is preferable to use a self-ordering method or a constant-voltage anodization because the insulating matrix is preferably an anodic oxide film obtained by anodizing an aluminum substrate and having micropores arrayed so as to have a degree of ordering of 50% or more defined by above formula (i).

Formation of micropores by a self-ordering method may be achieved by implementing anodization, anodic oxide film melting, and re-anodization in this order or by implementing a method whereby anodization and anodic oxide film melting are repeated several times, followed by re-anodization.

The constant-voltage anodization is a treatment for forming an anodic oxide film at a low speed taking a long time (say, a few hours to more than a dozen hours).

[Penetration Step]

The penetration step, following the anodization step, causes the micropores resulting from the anodization to penetrate the anodized aluminum substrate thereby to obtain the insulating matrix. Specifically, the penetration step may be implemented using a method whereby, after the anodization, an aluminum substrate is melted to remove the bottom portion of the anodic oxide film, a method whereby, after the anodization, the aluminum substrate and the anodic oxide film close to the aluminum substrate are severed, among other methods.

[Metal Filling Step]

In the method of producing the anisotropic conductive member, metal filling may be achieved using an electrolytic plating method or an electroless plating method.

Where an electrolytic plating method is used for metal filling in the method of producing the anisotropic conductive member, the electrolytic plating is preferably implemented by a potential scan method (potential scan electrolysis), whereby a potential is scanned at a constant speed as time passes or a constant-current method (constant-potential electrolysis), whereby the electrolysis is controlled to take place at a constant current.

[Surface Smoothing Process]

The method of producing the anisotropic conductive member preferably comprises, after the metal filling step, a surface smoothing process for smoothing the top and the reverse surface of the anisotropic conductive member by mechanical polishing, in particular, chemical mechanical polishing.

[Projecting Portion Forming Step]

The projecting portion forming step, following the metal filling step (or the surface smoothing step when the chemical mechanical polishing (CMP) is applied; the same applies to the following description of the projecting portion forming step below), causes the end portions of the formed conductive passages to project from the respective surfaces of the insulating matrix thereby to obtain the anisotropic conductive member.

Specifically, the end portions of the conductive passages can be caused to project from the respective surfaces of the insulating matrix by a trimming process and/or an electrodeposition process described below and, depending on the pitch and the diameter of the conductive passages, solder may be applied to the end portions of the conductive passages.

<Trimming Process>

The trimming process, following the metal filling step, removes part of only the insulating matrix of the anisotropic conductive member surfaces and causes the conductive passage to project.

<Electrodeposition Process>

In the method of producing the anisotropic conductive member, an electrodeposition process whereby the same conductive metal or a different conductive metal is further deposited on the surfaces of only the conductive passages 8 may be implemented in lieu of or after the trimming process.

[Protective Film Forming Process]

Considering the possible change in the diameter of the pores of the insulating matrix formed of alumina through hydration with water in the air as time passes, it is preferable to implement treatment for forming a protective film before the metal filling step.

The protective film is exemplified by an inorganic protective film containing Zr element and/or Si element or an organic protective film containing a water-insoluble polymer.

In the method of producing the anisotropic conductive member, a heating treatment enables control of hardness and heat-cycle resistance.

Heating is preferably done at a temperature of, for example, at least 100° C., more preferably 200° C. or more, and most preferably 400° C. or more. The heating time is preferably 10 seconds to 24 hours, more preferably 1 minute to 12 hours, and most preferably 30 minutes to 8 hours. Such heating treatment increases the hardness and inhibits expansion and contraction in heat cycle.

5. [Positioning of Circuit Board Connecting Structure]

The anisotropic conductive member has a positioning member preferably on its surface or lateral side. When the positioning member has a structure enabling positioning in conjunction with the counterpart of the rigid circuit board and/or the flexible circuit board, the positioning member proves useful for repeated use in electrical connection and disconnection. Further, such positioning member proves useful when the flexible circuit board of the circuit board connecting structure is replaced.

For example, the shape of a recess 118 of the pressure member 110, in which the anisotropic conductive member is inserted, becomes smaller in horizontal cross section toward the side closer to the rigid circuit board. Thus, merely fitting the anisotropic conductive member in the recess 118 achieves positioning in relation to the electrodes of the rigid circuit board, facilitating the replacement of the anisotropic conductive member. The positioning member may be provided between the flexible circuit board and the anisotropic conductive member. The positioning member may be a marker made on the anisotropic conductive member that acts in conjunction with a hole made in a lateral end of the flexible board. The anisotropic conductive member may have a positioning member located on a surface that does not come into contact with the electrodes or a lateral portion; the positioning member located on the lateral surface may be a conductive passage or a partially cut-out conductive passage.

6. [Electrical Connection Method]

The method of connecting circuit boards, which is the method of producing the circuit board connecting structure of the invention, is as follows.

A method of connecting circuit boards comprising: arranging 1) a rigid circuit board having first electrodes and 2) a flexible circuit board having second electrodes as lands formed on the circuit board, with a support plate 114 provided in direct contact with at least part of a flat surface of the flexible circuit board opposite from the rigid circuit board, and 4) electrically connecting at least part of the first electrodes of the rigid circuit board and at least part of the second electrodes of the flexible circuit board through conductive passages of an anisotropic conductive member by means of a pressure member adapted to urge an anisotropic conductive member onto the rigid circuit board and the flexible circuit board through a support plate, so that an insulating matrix of the anisotropic conductive member does not directly contact the flexible circuit board and that a pressure applied to surfaces of the lands is 300 MPa inclusive to 1000 MPa inclusive, 3) wherein the anisotropic conductive member has the conductive passages penetrating the insulating matrix in its thickness direction, the conductive passages being made of a conductive material and isolated from each other, one end of each of the conductive passages projecting from one surface of the insulating matrix and the other end of each of the conductive passages projecting from the other surface of the insulating matrix, a height H of the projecting portions projecting from the other surface and in an out-of-contact state being 5 µm or more and not greater than twice a thickness of the lands as measured from a surface of the flexible circuit board.

7. [Method of Replacing the Flexible Circuit Board of the Circuit Board Connecting Structure]

When the flexible circuit board of the circuit board connecting structure needs to be replaced because of degradation or needs to be replaced with a circuit board of a different structure, the replacement may be achieved by the following method.

A method of replacing the flexible circuit board comprising:
1) releasing a pressure applied by the pressure member of the circuit board connecting structure to electrically disconnect at least part of the first electrodes of the rigid circuit board and at least part of the second electrodes of the flexible circuit board, and
2) replacing the flexible circuit board with another flexible circuit board to electrically connect at least part of the first electrodes of the rigid circuit board and at least part of the second electrodes of the flexible circuit board again.

The circuit board connecting structure of the invention as applied to a liquid crystal panel inspection device will be described with reference to the schematic diagram of FIG. 8.

Figure 8:
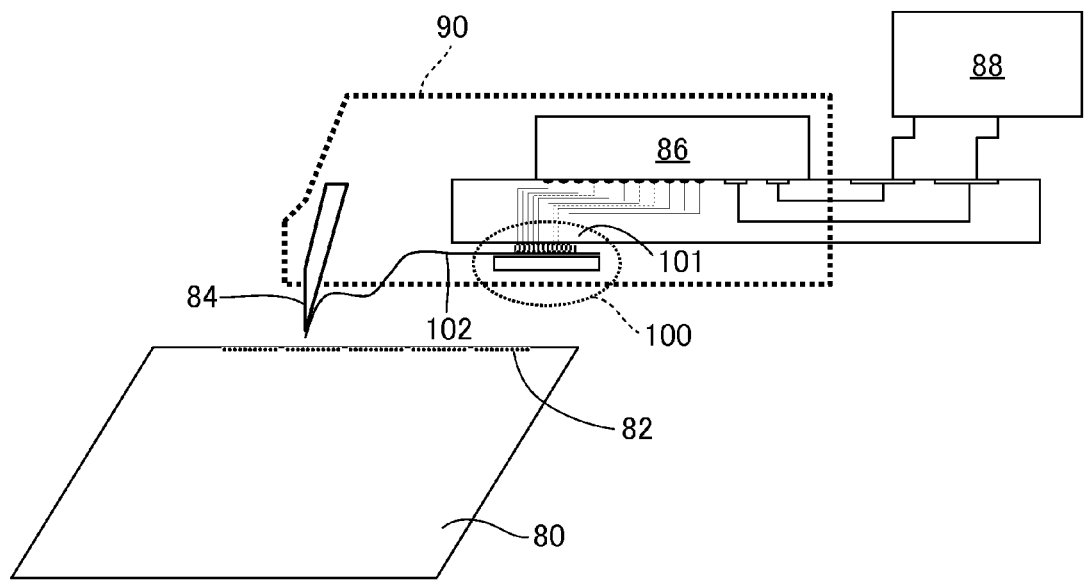
FIG. 8 is a schematic diagram for explaining a liquid crystal panel inspection device using the circuit board connecting structure of the invention.

A liquid crystal display (LCD) panel inspection probe unit 90 illustrated in FIG. 8 has an LCD driver IC 86 controlled by a control/inspection unit 88. The LCD driver IC 86 is electrically connected to the electrodes of the rigid circuit board 101. The rigid circuit board 101 and the flexible circuit board 102 connected to the inspection probe 84 are electrically connected through the anisotropic conductive member of the circuit board connecting structure 100 of the invention. In response to a signal from the LCD driver IC, the inspection probe 84 can drive the liquid crystal display panel 80 via liquid crystal panel drive electrodes 82, receive a signal from the panel, and supply a signal representing the inspection result to the control/inspection unit 88 via the circuit board connecting structure 100 of the invention. The control/inspection unit 88 can also display the inspection result.

The circuit board connecting structure of the invention can be applied not only to a probe unit used in a liquid crystal panel inspection device but a probe device used to inspect other, flat-shaped test objects such as integrated circuits.

EXAMPLES

The invention is described in detail below by way of examples. However, the invention should not be construed as being limited to such examples.

[Producing the Anisotropic Conductive Member]

(A) Mirror Finish Treatment (Elctrolytic Polishing)

A high-purity aluminum substrate (Sumitomo Light Metal Industries, Ltd.; purity, 99.99% by weight; thickness, 0.4 mm) was cut to a size of 10 cm squared permitting anodization, then subjected to electrolytic polishing using an electrolytic polishing solution of a composition indicated below at a voltage of 25 V, a solution temperature of 65° C., and a solution flow rate of 3.0 m/min.

A carbon electrode was used as the cathode, and a GP0110-30R unit (manufactured by Takasago, Ltd.) was used as the power supply. In addition, the flow rate of the electrolytic solution was measured using a vortex flow monitor FLM22-10PCW manufactured by As One Corporation.

(Electrolytic Polishing Solution Composition)

| | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

(B) Anodization Step (Self-Ordering Method)

Then, the aluminum substrate having undergone electrolytic polishing treatment was subjected to 10-hour pre-anodization treatment with a 0.5 mol/L electrolytic solution of oxalic acid at a voltage of 40 V, a solution temperature of 15° C., and a solution flow rate of 3.0 m/min.

In the film removing process that followed, the pre-anodized aluminum substrate was immersed for 12 hours in a mixed aqueous solution containing 0.2 mol/L chromic anhydride and 0.6 mol/L phosphoric acid at a solution temperature of 50° C.

Then, anodization treatment was applied again for 15 hours with a 0.5 mol/L electrolytic solution of oxalic acid at a voltage of 40 V, a solution temperature of 15° C., and a solution flow rate of 3.0 m/min.

The pre-anodizing treatment and the re-anodizing treatment were both carried out using a stainless steel electrode as the cathode and a GP0110-30R unit (manufactured by Takasago, Ltd.) as the power supply. Use was made of Neo-Cool BD36 (manufactured by Yamato Scientific Co., Ltd.) for cooling, and Pairstirrer PS-100 (manufactured by Tokyo Rikakikai Co., Ltd.) for stirring and heating. The flow rate of the electrolytic solution was measured with a vortex flow monitor FLM22-10PCW manufactured by As One Corporation.

(C) [Penetration Step]

Subsequently, the aluminum substrate was immersed in a treatment solution obtained by blending 0.1 mol/L copper chloride with a 20% aqueous solution of hydrochloric acid, allowed to dissolve therein at a solution temperature of 15° C. until removal of aluminum was observed by visual inspection, and further immersed in 5-wt % phosphoric acid at 30° C. for 30 minutes to remove the bottom portion of the anodic oxide film and obtain a structure (insulating matrix) consisting of an anodic oxide film having micropores with an enlarged diameter. The structure after the penetration process had a thickness of 120 µm.

(D) Heating Process

Then, the obtained structure was subjected to a heating treatment at 400° C. for one hour.

(E) Metal Filling Step

Subsequently, gold was vapor-deposited on one surface of the heat-treated structure to a thickness of 0.1 µm to form gold electrodes. The gold electrodes were used as cathode, and nickel balls were used as anode, to carry out electrolytic plating.

Using a 300 g/L aqueous solution of nickel sulfamate kept at 60° C. as electrolytic solution, direct current electrolysis was implemented to obtain a structure having nickel-filled micropores.

The direct current electrolysis was implemented using a plating device manufactured by YAMAMOTO-MS Co., Ltd. and the Model 7060 Potentiostat/Galvanostat manufactured by AMEL S.r.l. The standard electrodes used were of Ag/AgCl type.

The electrolysis was continued until the amount of electricity reached 4000 C/dm$^2$, with the scan performed at a scan speed of 1 mV/sec from Ni:0 V to the negative side.

Observation of fracture surfaces in the metal-filled structure with an optical microscope revealed that the micropores were filled with nickel to a height of about 70 μm measured from the side carrying the gold electrodes.

(F) Surface Smoothing Process

In the surface smoothing process that followed, the surface of the metal-filled structure on the side carrying the gold electrodes was polished by 10 μm, and the other surface thereof on the opposite side was polished by 60 μm.

More specifically, lapping was implemented with a sheet (#1200) bearing silicon carbide as an abrasive, followed by polishing with a diamond slurry having a particle diameter of 2 μm, and further with a diamond slurry having a particle diameter of 0.25 μm to obtain mirror-finish surfaces.

Observation of fracture surfaces in the surface-smoothed structure with an optical microscope revealed that the structure had smooth surfaces such that both the conductive passages (nickel) and the insulating matrix (anodic oxide film) had a thickness of 50 μm.

(G) Projecting Portion Forming Step (Manufacture of Anisotropic Conductive Members Having Different Projecting Portion Heights)

Then, the surface-smoothed structure was immersed in an aqueous solution of KOH having a concentration of 1% by weight, with the immersion time varied so as to control the amount of dissolution of only the alumina film and thereby produce anisotropic conductive members having different heights of the projecting portions of the nickel conductive passages among Examples and Comparative Examples as shown in Table 1.

Further, alternating-current electrolytic plating was also implemented using a sulfuric acid solution of tetrachloroaurate. The results of an ESCA analysis following the treatment showed that the nickel was coated with gold.

The processes from the metal filling (E) through the projecting portion forming step (G) were carried out continuously without interruption from the beginning of nickel plating to the end of gold plating without allowing the coating to be exposed to atmosphere.

After washing with water and drying, observation with an FE-SEM was made.

The results shown in Table 1 below revealed that the projecting portions of the conductive passages had heights given in Table 1, and the conductive passages had a diameter of 60 nm, the size of the electrodes. Observation also showed that the ratio of the center line length of the conductive passages to the thickness of the matrix (length/thickness) was 1.01.

The surfaces of the obtained anisotropic conductive members were photographed with an FE-SEM (magnification ×20000) to measure the degrees of ordering defined by the formula (i) of the micropores in the anisotropic conductive members in a 2 μm×2 μm field of view. The degree of ordering was measured in 10 places to calculate a mean value. The degree of ordering was in a range of 70% to 95% in any of Examples and Comparative Example.

Where the anisotropic conductive film is of anodic oxide film type, the period refers to the center-to-center distance (pitch) between conductive passages in both Examples and Comparative Examples. The surfaces of the obtained anisotropic conductive members (films) were photographed with an FE-SEM (magnification ×50000), and measurement was made at 50 points, yielding a mean value of the period in a range of 50 nm to 90 nm and a micropore density of about 150 million/mm$^2$.

<Rigid Circuit Board and Flexible Circuit Board>
(Test Pattern)

Figure 9:
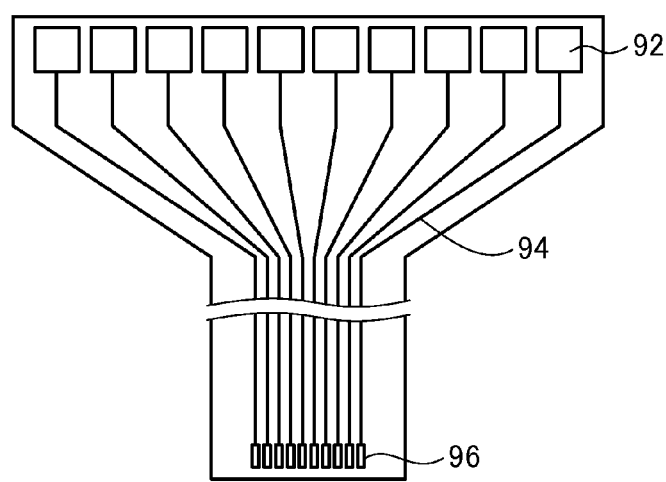
FIG. 9 is a schematic diagram for explaining a wiring pattern used for evaluation of the circuit board connecting structure.

A rigid circuit board (5 cm squared) and a flexible circuit board (FPC board, 5 cm×10 cm) both carrying a test pattern illustrated in FIG. 9 were procured and used. The same test pattern was fabricated and used on both the rigid circuit board and the flexible circuit board.

As illustrated in FIG. 9, the flexible circuit board uses a copper circuit pattern ending at quadrangular evaluation terminals 92, copper lines 94 having a line width of 10 μm connecting the evaluation terminals 92 and the second electrodes. The first electrodes are 10 quadrangular gold-plated connection electrodes 96 measuring 20 μm×100 μm on the rigid circuit board. The spacing interval between the electrodes were 50 μm. The second electrodes of the flexible circuit board and the first electrodes of the rigid circuit board were connected by the anisotropic conductive member fabricated in each of Examples and Comparative Examples, and the pressure member was allowed to apply pressures given in Table 1 in the respective examples.

(Electrodes)

The electrodes of the coupled rigid circuit board and flexible circuit board were adapted to have the same height as shown in Table 1. In Example 5 and Comparative Example 5, the coupled rigid circuit board and flexible circuit board had electrodes with a height of 16 μm; in the other Examples and Comparative Examples, the coupled rigid circuit board and flexible circuit board had electrodes with a height of 8 μm.

In Reference Example 7, use was made of the DAS8920 surface planar manufactured by Disco Corporation to planarize the surfaces of the lands on both the rigid circuit board and the flexible circuit board and secure a uniform land height. The treatment reduced the variation in electrode height from 3 μm to 0.6 μm and the surface roughness of the electrode surfaces from 1.2 μm to 0.04 μm in terms of Ra, and the circuit boards so treated were used.

<Pressure Member>

Use was made of a pressurizing mechanism consisting of screws and nuts and a 1-mm thick ceramic-made semitransparent support plate placed in direct contact with the flexible circuit board.

The rigid board was mounted to the lower sample stage of a surface mount tester (Model 6000 manufactured by HiSOL, Inc.), and a ceramic-made pressurizing jig in which the flexible circuit board described above was attached was mounted to the upper sample stage, whereupon alignment adjustment was made. Subsequently, the anisotropic conductive film described above was mounted in a predetermined position of the rigid board in the lower stage, and brought into pressurized contact. The pressure was adjusted viewing the display so that a desired pressure is applied to the surfaces of the electrodes (lands).

<Evaluation of Connection>

The connection attained by pressurized contact was evaluated by providing gold bumps having the same shape on a glass board and urging thereon each of the anisotropic conductive members fabricated in Examples and Comparative Examples and observing the state.

After being pressurized with each of the pressures shown in Table 1, the structure was allowed to stand for three days, the anisotropic conductive film was detached, and the same anisotropic conductive film was inserted back again, repeating the process. Evaluation was conducted by observing the surface of the FPC board when the film was detached for the 10th time and the 50th time.

<Evaluation Criteria>

(1) Connection resistance evaluation criteria: good when connection resistance is less than 1Ω; poor when it is not less than 1Ω.

(2) Connection Evaluation Criteria

A when the insulation layer is out of contact with the flexible circuit board (FPC board).

B when the insulation layer is in contact with the flexible circuit board (FPC board).

C when the insulation layer is broken and in contact with the flexible circuit board (FPC board).

(3) Flexible Circuit Board (FPC Board) Wiring Damage Evaluation

The state of the wiring on the FPC board was visually evaluated after attachment and detachment were repeated over the number of times shown in Table 1. Ratings were:

Good when no change was observed.

Average when the surface had matter adherent thereto.

Poor when scratches were observed on the wiring.

The results shown in Table 1 reveal that the structures in Examples 1 to 7 were capable of electrically connecting circuit boards stably and with a low resistance and that, for example, unnecessary bonding to the non-electrode members does not occur in connection, reducing the possibility of circuit boards being broken by a load that may otherwise be applied in detachment.

Table 1 also shows that, in Comparative Examples 4 and 5, the height of the projecting portions was at least twice the electrode height, making the connection between projecting portions and electrodes unstable. Thus, a load is applied upon attachment and detachment, causing scratches on the wiring, which forms part of the surface of the circuit boards carrying the electrodes. The structure in Reference Example 7 is capable of performance comparable to the performance of the structures in Examples but expensive.

We claim:

1. A circuit board connecting structure comprising:
a rigid circuit board having a first electrode,
an anisotropic conductive member, and
a flexible circuit board having a second electrode as a land formed on the flexible circuit board, a support plate being provided in direct contact with at least part of a flat surface of the flexible circuit board opposite from the rigid circuit board,
the anisotropic conductive member being connected to the rigid circuit board and the flexible circuit board by a pressure member,
wherein the anisotropic conductive member includes conductive passages penetrating an insulating matrix in a thickness direction of the insulating matrix, the conductive passages being made of a conductive material comprising a metal or a metal alloy; and isolated from each other, one end of each of the conductive passages having a first projecting portion projecting from one surface of the insulating matrix and another end of each of the conductive passages having a second projecting portion projecting from another surface of the insulating matrix, a height of the second projecting portion out of contact being 5 μm or more and not greater than twice a thickness of the land as measured from a surface of the flexible circuit board,
wherein electrical connection between the rigid circuit board and the flexible circuit board is achieved as the

TABLE 1

| | Electrode height (μm) | Type of anisotropic conductive film | Projecting portion height (μm) | Pressure (Mpa) | Connection Resistance | Connection Visual Exam | FPC wiring damage Removed 10 times | FPC wiring damage Removed 50 times |
|---|---|---|---|---|---|---|---|---|
| Example 1 | 8 | Anodic oxide film type | 8 | 300 | Good | A | Good | Good |
| Example 2 | 8 | Anodic oxide film type | 5 | 300 | Good | A | Good | Good |
| Example 3 | 8 | Anodic oxide film type | 15 | 300 | Good | A | Good | Good |
| Example 4 | 8 | Anodic oxide film type | 15 | 500 | Good | A | Good | Good |
| Example 5 | 8 | Anodic oxide film type | 15 | 800 | Good | A | Good | Good |
| Example 6 | 8 | Anodic oxide film type | 10 | 300 | Good | A | Good | Good |
| Example 7 | 16 | Anodic oxide film type | 30 | 300 | Good | A | Good | Good |
| Com. Ex. 1 | 8 | Anodic oxide film type | 5 | 30 | Poor | A | Good | Good |
| Com. Ex. 2 | 8 | Anodic oxide film type | 2 | 300 | Poor | A | Good | Good |
| Com. Ex. 3 | 8 | Anodic oxide film type | 15 | 1100 | Good | C | — | — |
| Com. Ex. 4 | 8 | Anodic oxide film type | 30 | 300 | Good | A | Poor | Poor |
| Com. Ex. 5 | 16 | Anodic oxide film type | 50 | 300 | Good | A | Poor | Poor |
| Com. Ex. 6 | 8 | Metal particle containing resin type | | 300 | Good | B | Poor | Poor |
| Ref. Ex. 7 | 8 Surface smoothing | Anodic oxide film type | 1 | 30 | Good | A | Good | Good | first projecting portions of the conductive passages contact at least part of the first electrode of the rigid circuit board and the second projecting portions communicating with the first projecting portions through the conductive passages contact at least part of the surface of the land formed on the flexible circuit board, a pressure being applied such that the insulating matrix of the anisotropic conductive member does not directly contact the flexible circuit board, and wherein the pressure applied to the surface of the land is 300 MPa inclusive to 1000 MPa inclusive.

2. The circuit board connecting structure according to claim 1, wherein the circuit board connecting structure in electrical connection described in claim 1 can be placed in electrical disconnection by releasing the pressure applied by the pressure member.

3. The circuit board connecting structure according to claim 1, wherein the conductive passages have a diameter of 200 nm or less.

4. The circuit board connecting structure according to claim 1, wherein the insulating matrix includes an anodic oxide film having micropores obtained by anodizing an aluminum substrate.

5. The circuit board connecting structure according to claim 4,
wherein a ratio of a number X of micropores per unit area on one surface of the anodic oxide film to a number Y of micropores per unit area on another surface, X/Y, is 0.90 to 1.10.

6. The circuit board connecting structure according to claim 1, wherein a total thickness of the first projecting portions in contact, the second projecting portions in contact, and the insulating matrix of the anisotropic conductive member is not greater than a total thickness of the first projecting portions, the second projecting portions, and the insulating matrix in the electrical disconnection.

7. The circuit board connecting structure according to claim 1,
wherein a height of the first projecting portions out of contact and a height of the second projecting portions out of contact of the conductive passages are substantially the same, and
wherein a metal constituting the conductive material is nickel.

8. The circuit board connecting structure according to claim 1, wherein the anisotropic conductive member has a positioning member on a surface out of contact with the electrode or on a lateral portion, the positioning member acting in conjunction with a positioning member of the rigid circuit board and/or the flexible circuit board to achieve positioning.

9. The circuit board connecting structure according to claim 1,
wherein a ratio of a center line length of intra-matrix sections of the conductive passages to the thickness of the insulating matrix (length/thickness) is 1.0 to 1.2.

10. The circuit board connecting structure according to claim 1,
wherein the insulating matrix has a thickness of 1 μm to 1000 μm.

11. The circuit board connecting structure according to claim 1,
wherein a distance between the conductive passages in the insulating matrix is at least 10 nm.

12. The circuit board connecting structure according to claim 1,
wherein the distance between the conductive passages is 20 nm to 500 nm.

13. The circuit board connecting structure according to claim 1,
wherein a density of the conductive passages in a surface of the insulating matrix is at least 2 million/mm$^2$.

14. The circuit board connecting structure according to claim 1,
wherein the conductive passages each have a diameter of 200 nm or less, and
wherein the circuit board connecting structure, after connection is made using the pressure member under a pressure of 300 MPa inclusive to 1000 MPa inclusive, so as to be the circuit board connecting structure, can be placed in electrical disconnection by releasing the pressure applied by the pressure member.

15. The circuit board connecting structure according to claim 14,
wherein the insulating matrix of the anisotropic conductive member includes an anodic oxide film having micropores obtained by anodizing an aluminum substrate.

16. The circuit board connecting structure according to claim 1,
wherein the insulating matrix of the anisotropic conductive member includes an anodic oxide film having micropores obtained by anodizing an aluminum substrate, and
wherein the circuit board connecting structure, after connection is made using the pressure member under a pressure of 300 MPa inclusive to 1000 MPa inclusive, so as to be the circuit board connecting structure, can be placed in electrical disconnection by releasing the pressure applied by the pressure member.

17. The circuit board connecting structure according to claim 1,
wherein the insulating matrix of the anisotropic conductive member includes an anodic oxide film having micropores obtained by anodizing an aluminum substrate, and
wherein a ratio of a center line length of intra-matrix sections of the conductive passages to a thickness of the insulating matrix (length/thickness) is 1.0 to 1.2.

18. The circuit board connecting structure according to claim 1,
wherein the insulating matrix of the anisotropic conductive member includes an anodic oxide film having micropores obtained by anodizing an aluminum substrate, and
wherein a ratio of a number X of micropores per unit area on one surface of the anodic oxide film to a number Y of micropores per unit area on another surface, X/Y, is 0.90 to 1.10.

19. The circuit board connecting structure according to claim 1, wherein electrical connection between the rigid circuit board and the flexible circuit board is achieved through a part of the first projecting portions and a part of the second projecting portions.

20. The circuit board connecting structure according to claim 1,
wherein a density of the conductive passages in a surface of the insulating matrix is at least 100 million/mm$^2$.

21. The circuit board connecting structure according to claim 1,
wherein the metal or the metal alloy of the conductive material can be plastic deformed by the pressure applied to the surface of the land.

22. The circuit board connecting structure according to claim 1,
wherein the conductive material consists essentially of the metal.

23. The circuit board connecting structure according to claim 1, wherein the insulating matrix includes an anodic oxide film having micropores obtained by anodizing an aluminum substrate and
a density of the conductive passages in a surface of the insulating matrix is at least 2 million/mm$^2$.

24. A method of connecting circuit boards comprising:
arranging a rigid circuit board having a first electrode, and a flexible circuit board having a second electrode as land formed on the flexible circuit board, with a support plate provided in direct contact with at least part of a flat surface of the flexible circuit board opposite from the rigid circuit board and,
electrically connecting at least part of the first electrode of the rigid circuit board and at least part of the second electrode of the flexible circuit board through conductive passages of the anisotropic conductive member by means of a pressure member adapted to urge an anisotropic conductive member onto the rigid circuit board and the flexible circuit board through a support plate, so that an insulating matrix of the anisotropic conductive member does not directly contact the flexible circuit board and that a pressure applied to surface of the land is 300 MPa inclusive to 1000 MPa inclusive,
wherein the anisotropic conductive member has the conductive passages penetrating the insulating matrix in its thickness direction, the conductive passages being made of a conductive material comprising a metal or a metal alloy; and isolated from each other, one end of each of the conductive passages projecting from one surface of the insulating matrix and the other end of each of the conductive passages projecting from the other surface of the insulating matrix, a height of the projecting portions projecting from the other surface and in an out-of-contact state being 5 µm or more and not greater than twice a thickness of the land as measured from a surface of the flexible circuit board.

25. A method of replacing a flexible circuit board, comprising:
releasing a pressure applied by the pressure member electrically connected in claim 24 to electrically disconnect at least part of the first electrode of the rigid circuit board and at least part of the second electrode of the flexible circuit board, replacing a flexible circuit board with another flexible circuit board, and electrically connecting at least part of the first electrode of the rigid circuit board and at least part of the second electrode of the flexible circuit board again.

* * * * *